United States Patent
Keite-Telgenbüscher et al.

(10) Patent No.: US 10,144,853 B2
(45) Date of Patent: Dec. 4, 2018

(54) ADHESIVE COMPOUND WITH REDUCED YELLOWNESS INDEX

(71) Applicant: TESA SE, Norderstedt (DE)

(72) Inventors: Klaus Keite-Telgenbüscher, Hamburg (DE); Anita Reichenbach, Bruchhausen-Vilsen (DE); Christian Schuh, Hamburg (DE)

(73) Assignee: TESA SE, Norderstedt (DE)

( * ) Notice: Subject to any disclaimer, the term of this patent is extended or adjusted under 35 U.S.C. 154(b) by 0 days.

(21) Appl. No.: 15/548,295

(22) PCT Filed: Feb. 5, 2016

(86) PCT No.: PCT/EP2016/052517
§ 371 (c)(1),
(2) Date: Aug. 2, 2017

(87) PCT Pub. No.: WO2016/124744
PCT Pub. Date: Aug. 11, 2016

(65) Prior Publication Data
US 2018/0016476 A1    Jan. 18, 2018

(30) Foreign Application Priority Data
Feb. 6, 2015   (DE) .................. 10 2015 202 157

(51) Int. Cl.
*H01L 51/52*      (2006.01)
*C09J 11/06*      (2006.01)
(Continued)

(52) U.S. Cl.
CPC .............. *C09J 11/06* (2013.01); *C08L 71/02* (2013.01); *C08L 101/00* (2013.01);
(Continued)

(58) Field of Classification Search
CPC .................. H01L 51/0035; H01L 51/448; H01L 51/5237
See application file for complete search history.

(56) References Cited

U.S. PATENT DOCUMENTS 3,729,313 A   4/1973   Smith
3,741,769 A   6/1973   Smith
(Continued)

FOREIGN PATENT DOCUMENTS

DE    34 40 183 A1   6/1988
EP    542 716 B1    6/1997
(Continued)

OTHER PUBLICATIONS

"Handbook of Pressure Sensitive Adhesive Technology" by Donatas Satas (Satas & Associates, Warwick 1999).
(Continued)

*Primary Examiner* — Douglas Menz
(74) *Attorney, Agent, or Firm* — Norris McLaughlin P.A.

(57) ABSTRACT

Adhesive compounds and methods contain at least one reactive resin, at least one elastomer, at least one polar photoinitiator and, optionally, a non-aqueous solvent. The adhesive compounds and method further containing a non-ionic surfactant for reducing the yellowness index of the cured adhesive compound, having a reduced yellowing tendency after the crosslinking step. The adhesive compound may be preferably a pressure-sensitive adhesive compound and the elastomer may be preferably a non-polar elastomer.

14 Claims, 2 Drawing Sheets

(51) Int. Cl.
  *C09J 163/00* (2006.01)
  *C09J 153/00* (2006.01)
  *H01L 51/00* (2006.01)
  *H01L 51/44* (2006.01)
  *C08L 71/02* (2006.01)
  *C08L 101/00* (2006.01)

(52) U.S. Cl.
  CPC ........... *C09J 153/00* (2013.01); *C09J 163/00* (2013.01); *H01L 51/0035* (2013.01); *H01L 51/448* (2013.01); *H01L 51/5237* (2013.01)

(56) References Cited

U.S. PATENT DOCUMENTS

| | | |
|---|---|---|
| 4,058,401 A | 11/1977 | Crivello |
| 4,138,255 A | 2/1979 | Crivello |
| 4,231,951 A | 11/1980 | Smith et al. |
| 4,250,053 A | 2/1981 | Smith |
| 4,256,828 A | 3/1981 | Smith |
| 4,394,403 A | 7/1983 | Smith |
| 4,788,233 A | 11/1988 | Sakakibara et al. |
| 5,695,837 A | 12/1997 | Everaerts et al. |
| 6,908,722 B2 | 6/2005 | Ebata et al. |
| 7,388,044 B2 | 6/2008 | McGee et al. |
| 2009/0298965 A1 | 12/2009 | Kimura et al. |
| 2010/0063221 A1 | 3/2010 | Manabe et al. |
| 2011/0105637 A1 | 5/2011 | Fujita et al. |

FOREIGN PATENT DOCUMENTS

| | | |
|---|---|---|
| JP | H11-504054 A | 4/1999 |
| JP | H11-209737 A | 8/1999 |
| JP | 2001-011424 A | 1/2001 |
| JP | 2009-292881 A | 12/2009 |
| JP | 2010 077 049 A | 4/2010 |
| JP | 2011-526629 A | 10/2011 |
| JP | 2012 083 405 A | 4/2012 |
| JP | 2012-140610 A | 7/2012 |
| WO | 1998/033645 A | 8/1998 |
| WO | 2012/045588 A | 4/2012 |
| WO | 2013/105455 A1 | 7/2013 |

OTHER PUBLICATIONS

English Translation of International Search Report dated Apr. 22, 2016, dated May 18, 2016.
International Search Report dated Apr. 22, 2016, dated May 18, 2016.
English translation of Japanese Office Action corresponds to Japanese application No. 2017-541296 dated Jul. 24, 2018.

ADHESIVE COMPOUND WITH REDUCED YELLOWNESS INDEX

This application is a 371 application of PCT/EP2016/052517 filed Feb. 5, 2016, which claims foreign priority benefit under 35 U.S.C. § 119 of German application 10 2015 202 157.6 filed Feb. 6, 2015.

The present invention relates to an adhesive composition comprising an adhesive base composed of at least one reactive resin, at least one elastomer, and at least one polar photoinitiator, and, optionally, a nonaqueous solvent.

Compounds used for the light-induced curing of epoxide adhesives include iodonium salts and/or sulfonium salts. Adhesive compounds of this kind are employed, for example, as barrier adhesives. Within recent years, barrier adhesives have acquired importance increasingly as protection for (opto)electronic applications. (Opto)electronic arrangements are being used more and more often in commercial products. Such arrangements comprise inorganic or organic electronic structures, examples being organic, metal-organic or polymeric semiconductors, or else combinations of these.

Examples of (opto)electronic applications which are already commercial or are of interest in their market potential include electrophoretic or electrochromic assemblies or displays, organic or polymeric light-emitting diodes (OLEDs or PLEDs) in indicator and display devices or as lighting, electroilluminescent lamps, light-emitting electrochemical cells (LEECs), organic solar cells, preferably dye or polymer solar cells, inorganic solar cells, preferably thin-film solar cells, based more particularly on silicon, germanium, copper, indium, and selenium, organic field-effect transistors, organic switching elements, organic optical amplifiers, organic laser diodes, organic or inorganic sensors, or else organically or inorganically based RFID transponders.

A perceived technical challenge for the realization of sufficient lifetime and function of (opto)electronic arrangements in the area of inorganic and/or organic (opto)electronics, but especially in the area of organic (opto)electronics, is the protection of the components they contain against permeants. Permeants may be a large number of low molecular mass organic or inorganic compounds, especially water vapor and oxygen.

Barrier adhesives have become established as a protection for these components. Such barrier adhesives seal the components and so protect them from water vapor and oxygen. A good adhesive composition for the sealing of (opto) electronic components therefore has low permeability for oxygen and especially for water vapor; in addition, it has sufficient adhesion to the arrangement and is able to flow effectively onto it.

One example of such highly suitable barrier adhesives are so-called 3G barrier adhesives, these being hybrid adhesives composed of synthetic rubber and epoxides. In such 3G barrier adhesives, which are highly apolar, a yellow discoloration occurs after irradiation with UV light. This is a disadvantage, since the adhesive is to be used, for example, for encapsulation of displays, and, accordingly, exacting demands are imposed on the optical quality.

The reason for the yellow discoloration that occurs lies in the photoinitiators used. The photoinitiators used absorb light in the range from ~200 nm to 400 nm, and so in part already bring with them a slight discoloration, depending on the concentration used. Even colorless photoinitiators, however, may give rise to slight discoloration after irradiation with UV light. For molecules to absorb light in the spectral range stated above, they must possess a delocalized π-electron system. In this case, the absorption wavelength is shifted further and further into the visible range in line with the number of (hetero)atoms involved. Ideally, the irradiation of the photoinitiators results in the formation of the active species and at the same time, owing to bonds being broken, in a reduction in the size of the π-electron system. This shifts the absorption toward lower wavelengths further removed from the visible range. Frequently, however, in actual fact, a number of active photoinitiator molecules combine to form a larger π-electron system. This is a disadvantage in two respects. Firstly, the initiator molecules recombining in this way are no longer available for the crosslinking reaction; secondly, the unwanted yellow discoloration develops.

In order to avoid the unwanted yellow discoloration, it is known practice to date to add antioxidants to the adhesive composition. This is described, for example, in WO 2012/045588 A1. Leaving aside the fact that the reduction in yellowness index is still not achieved in the degree desired, the photoinitiators which can be used according to that specification are limited. For instance, iodonium salts are not suitable as photoinitiators.

The object of the invention, therefore, was to provide an adhesive composition which after the crosslinking step suffers significantly less yellowing than the adhesive compositions of the prior art and, furthermore, can be produced using a very large spectrum of photoinitiators.

The object is achieved in accordance with the invention if, in an adhesive composition of the type specified at the outset, the adhesive composition further comprises a nonionic surfactant in order to reduce the yellowness index of the cured adhesive composition.

DETAILED DESCRIPTION OF THE DISCLOSURE

Figure 1:
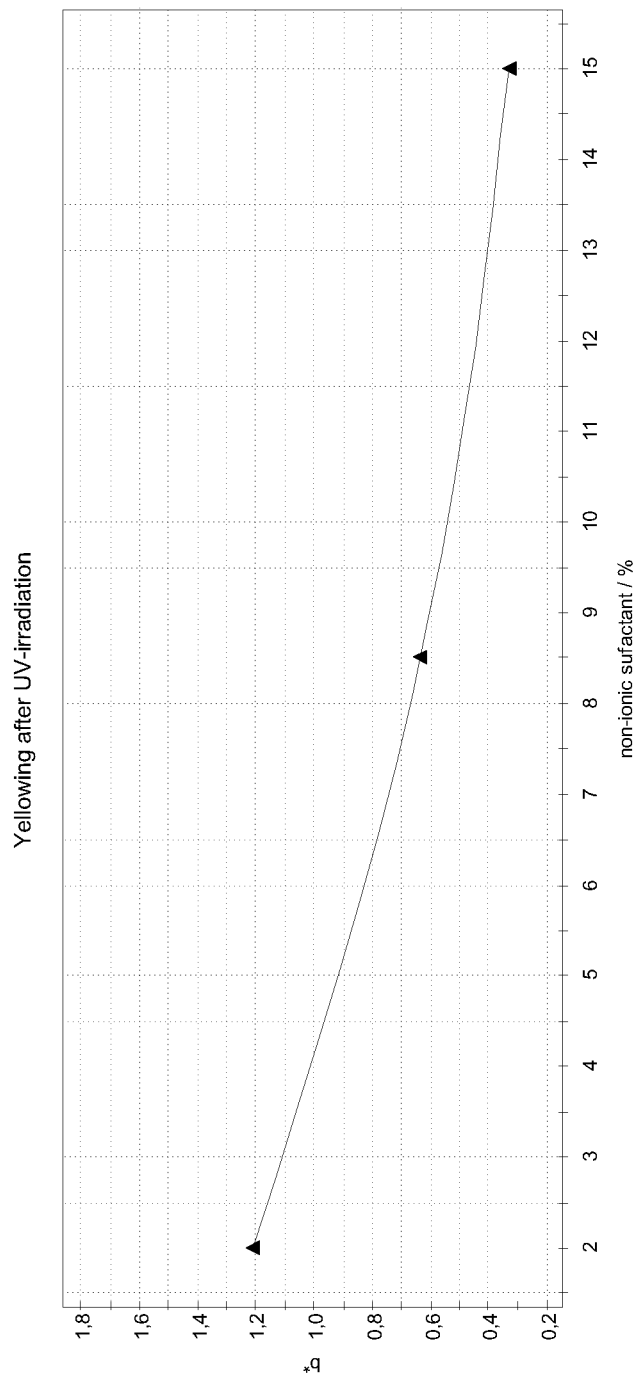
FIG. 1 illustrates a graph showing yellowness index b* after UV irradiation as a function of the amount of surfactant relative to the reactive resin.

Surfactants are employed from time to time in adhesives. Thus, for example, U.S. Pat. No. 7,388,044 B2 describes the use of anionic surfactants for dispersing epoxides as apolar substances in water in the course of the production of liquid adhesives. Surfactants are frequently identified as possible auxiliaries, as for example in JP 2012 083 405 A, as an antistatic additive, or in JP 2010 077 049 A, for improving the wetting. In WO 1998033645 A1 as well, surfactants are used in liquid adhesives in order to improve the crosslinking behavior. In this context, a maximum of 2% surfactant is employed, based on the reactive resin.

Surprisingly, in the context of the present invention, it has been ascertained that nonionic surfactants act favorably on the yellowing of adhesives. It has been found that the chemical environment of the photoinitiator has a significant influence on the discoloration. Thus, in relatively polar substances such as trimethylpropane oxetane (TMPO), for example, there are significantly fewer instances of discoloration (b*~0.8) than in the apolar elastomer (Kraton G 1657). Here it was possible to observe a large number of small, punctiform discolorations. The much more polar photoinitiator agglomerates in an apolar environment. Since additionally, in this example, there are also no co-reactants present, the conclusion can be drawn that the discoloration is attributable to the reactions of the excited photoinitiator with itself and/or with its decomposition products.

In relation to the yellowing tendency, therefore, an adhesive composition of maximum polarity would be desirable. This requirement, however, runs contrary to the requirements for a barrier adhesive, in other words an adhesive composition which is suitable, for example, for the encapsulation of products sensitive to moisture. The encapsulation of products sensitive to moisture requires a very apolar adhesive composition. This composition ought, furthermore, advantageously to have a high crosslinking density. Surprisingly it has been found that through the addition of nonionic surfactants, there is a significant reduction in the yellow discoloration of the adhesive composition after it has cured. This is presumably due to the fact that the polar photoinitiators are finely dispersed in the apolar elastomer matrix. Agglomeration of the photoinitiator is therefore prevented. Adding the surfactant leads to a significant reduction in the yellow coloration after UV irradiation. The conversion of cationically curing epoxide systems is typically increased by thermal aftertreatment. In that case, the effect is even more pronounced. The yellowness index is greatly reduced.

With particular preference, the reactive resin component is a cyclic ether or a mixture of at least two cyclic ethers. Particularly suitable in this context are epoxides, in other words compounds which carry at least one oxirane group, and oxetanes. They may be aromatic or, in particular, aliphatic or cycloaliphatic in nature. Reactive resins which can be used may be monofunctional, difunctional, trifunctional, tetrafunctional or of higher functionality, through to polyfunctional, in form, with the functionality pertaining to the cyclic ether group. The reactive resin is present preferably in an amount of 15 to 95 wt %. In the case of a pressure sensitive adhesive composition, the amount of reactive resin is especially 15 to 45 wt % and very preferably 15 to 33 wt %. In the case of liquid formulations, the reactive resin fraction is especially 55 to 95 wt %, very preferably 55 to 75 wt %. In one particularly well-balanced formulation, the reactive resin fraction is, in particular, 40 to 60 wt %. The figures are based in each case on the weight fraction in the adhesive base without solvent.

It has emerged that in the case of the adhesive of the invention, as a result of the addition of the nonionic surfactants, not only the polar photoinitiators but also the epoxide monomers or oxetane monomers are finely dispersed in the apolar elastomer matrix. In this way, moreover, as well as the prevention of agglomeration of the photoinitiator, the excited photoinitiator molecules find epoxide and/or oxetane monomers immediately after UV irradiation. This results in an additional reduction in the yellow discoloration of the adhesive composition.

The adhesive composition is advantageously a pressure sensitive adhesive composition. Pressure-sensitively adhesive compositions permit particularly simple handling and can be readily applied. Where two components are joined using pressure sensitive adhesive composition, there is a certain fixing of the components to one another even prior to the crosslinking and ultimate curing of the adhesive composition. For these reasons, pressure sensitive adhesive compositions are particularly suitable for a wide variety of different applications.

Furthermore, it is particularly useful if the adhesive composition further comprises at least one at least partially hydrogenated tackifier resin component. Particular preference is given in this context to those which are compatible with the elastomer component or, where a copolymer constructed of hard blocks and soft blocks is employed, primarily with the soft block (plasticizer resins). They are known to the skilled person, for example, from the "Handbook of Pressure Sensitive Adhesive Technology" by Donatas Satas (Satas & Associates, Warwick 1999).

It is advantageous if a tackifier resin of this kind has a softening temperature, measured by the ring & ball method, of greater than 25° C. It is advantageous, moreover, if in addition at least one kind of tackifier resin having a softening temperature of less than 20° C. is used. By this means it is possible, if necessary, to fine-tune on the one hand the technical bonding performance but on the other hand also the flow-on performance on the bond substrate.

For relatively apolar elastomers, resins which can be employed in the pressure sensitive adhesive composition are, advantageously, partially or fully hydrogenated resins based on rosin and rosin derivatives, hydrogenated polymers of dicyclopentadiene, partially, selectively or fully hydrogenated hydrocarbon resins based on $C_5$, $C_5/C_9$ or $C_9$ monomer streams, polyterpene resins based on α-pinene and/or β-pinene and/or δ-limonene and/or $\Delta^3$-carene, hydrogenated polymers of preferably pure $C_8$ and $C_9$ aromatics. The aforesaid tackifier resins may be used either alone or in a mixture.

In this context, it is possible to use resins which are liquid and resins which are solid at room temperature. In order to ensure high aging stability and UV stability, preference is given to hydrogenated resins having a degree of hydrogenation of at least 90%, preferably at least 95%.

The fraction of elastomer (including possible tackifier resins) in the adhesive composition is preferably 20 to 95 wt %. In the case of a pressure sensitive adhesive composition, the amount of elastomer is, in particular, 55 to 85 wt % and very preferably 65 to 85 wt %. In the case of liquid formulations, the reactive resin fraction is, in particular, 5 to 45 wt %, very preferably 25 to 45 wt %. In a particularly well-balanced formulation, the reactive resin fraction is, in particular, 40 to 60 wt %. The figures are based in each case on the weight fraction in the adhesive base without solvent.

Neither reactive resin nor elastomer, tackifier resin or photoinitiator are present in an aqueous dispersion or have been prepared from such as dispersion, since otherwise unwanted interactions may occur with the surfactants already present in these dispersions.

The fraction of nonionic surfactant, based on the amount of reactive resin, is preferably 1 to 50%, especially 3 to 30%, preferably 4 to 20%, and very preferably 5 to 17%. For example, a fraction of 10% of nonionic surfactant, based on the amount of reactive resin, means that for a quantity of 1 kg of reactive resin 100 g of nonionic surfactant are added.

In the case of the adhesive compositions of the invention, the surfactant is not incorporated into the adhesive framework, and is not part of the adhesive system. The nonionic surfactant is therefore different from the adhesive-composition components that are used. In the present invention, the function of the surfactant is that of encapsulating the photoinitiator, and it acts as a micelle former.

The adhesive composition may further comprise at least one nonaqueous solvent. Suitable solvents in this case are all solvents and mixtures known to the skilled person and dissolving not only the apolar elastomer component but also the polar reactive resins. Particularly suitable in this context are toluene, ethyl acetate, benzine, heptane, acetone, and butanone. Through the addition of solvents, the viscosity of the adhesive can be adjusted particularly effectively and easily.

The adhesive is preferably subjected to thermal or irradiation-induced curing. In this way it is possible to transport the adhesive composition in liquid form, permitting easy application of the adhesive composition at the site of use. Not until an external stimulus is received (heat or radiation) does the adhesive composition undergo curing. Cationic curing is particularly preferred here.

Particularly preferred, furthermore, are those adhesive compositions whose adhesive base has a water vapor permeation rate, after the activation of the reactive resin component, of less than 100 g/m²d, preferably of less than 50 g/m²d, especially less than 15 g/m²d. These are adhesives which exhibit a particularly good barrier effect and are able to protect electronic components effectively from the penetration of water vapor.

The present invention relates, furthermore, to an adhesive tape comprising an adhesive composition of the invention. The adhesive tape here may be coated on one side or on both sides with the adhesive composition of the invention. The adhesive tape may also be an adhesive transfer tape. An adhesive tape permits particularly simple and precise bonding and is therefore particularly suitable.

The present invention relates, moreover, to the use of the adhesive composition of the invention and/or of the adhesive tape of the invention as a sealant, especially for the encapsulation of assemblies in organic electronics. As stated above, it is of preeminent importance in organic electronics that the components must be protected from water (vapor). On account of their very good barrier properties, the adhesive compositions and/or adhesive tapes of the invention are capable of providing such protection.

The present invention relates, in addition, to the use of nonionic surfactants for reducing the yellowness index of cationically curing, apolar adhesive compositions.

Lastly, the present invention relates to a method for producing an adhesive composition of the invention, comprising the steps of
a) dissolving elastomer and optionally tackifier resin in a nonaqueous solvent;
b) adding a solution of reactive resin, nonionic surfactant, and polar photoinitiator;
c) stirring all the components.

This sequence of the steps ensures that the polar photoinitiator comes effectively into contact with the reactive resin. On the other hand, formation of agglomerates of the polar photoinitiator is prevented.

Pressure-sensitive adhesives (PSAs) are adhesives which permit a durable join to the substrate even under relatively weak applied pressure and which after use can be detached from the substrate again substantially without residue. PSAs have a permanently pressure-sensitively adhesive effect at room temperature, hence having a sufficiently low viscosity and a high initial tack, allowing them to wet the surface of the respective substrate even under low applied pressure. The bondability of such adhesives derives from their adhesive properties, and the redetachability from their cohesive properties. A variety of materials are suitable as a basis for PSAs.

The feature of apolar elastomers such as, for example, vinylaromatic block copolymers is that they can be dissolved in apolar solvents, i.e., in solvents and/or solvent mixtures whose polarity corresponds to that of ethyl acetate, or which are more apolar. These are, in particular, solvents and/or solvent mixtures having a dielectric constant of less than 6.1 [http://en.wikipedia.org/wiki/Solvent] and/or having Hansen parameters δP polar ≤5.3: δH hydrogen bonding ≤7.2 (Abbott, Steven and Hansen, Charles M. (2008) Hansen Solubility Parameters in Practice, ISBN 0-9551220-2-3 or Hansen, Charles M. (2007) Hansen solubility parameters: a users handbook CRC Press, ISBN 0-8493-7248-8).

Where block copolymers are employed as elastomers, they include at least one kind of block having a softening temperature of greater than 40° C., such as, for example, vinylaromatics (including partly or fully hydrogenated variants), methyl methacrylate, cyclohexyl methacrylate, isobornyl methacrylate, and isobornyl acrylate.

With further preference the block copolymer includes one kind of block having a softening temperature of less than −20° C.

Examples of polymer blocks with low softening temperatures ("soft blocks") are polyethers such as, for example, polyethylene glycol, polypropylene glycol or polytetrahydrofuran, polydienes such as, for example, polybutadiene or polyisoprene, (partially) hydrogenated polydienes such as, for example, polyethylenebutylene, polyethylenepropylene or polybutylenebutadiene, polybutylene, polyisobutylene, polyalkyl vinyl ethers, polymer blocks of α,β-unsaturated esters such as in particular, acrylate copolymers.

In one embodiment here, the soft block is of apolar construction and in that case comprises preferably butylene or isobutylene or hydrogenated polydienes as homopolymer block or copolymer block, the latter preferably copolymerized with itself or with one another or with further comonomers, which with particular preference are apolar comonomers. Examples of suitable apolar comonomers are (partially) hydrogenated polybutadiene, (partially) hydrogenated polyisoprene and/or polyolefins.

The crosslinkable component, also referred to as reactive resin, consists of a cyclic ether and is suitable for radiation crosslinking and, optionally, thermal crosslinking, with a softening temperature of less than 40° C., preferably of less than 20° C.

The reactive resins based on cyclic ethers are, in particular, epoxides, in other words compounds which carry at least one oxirane group, or oxetanes. They may be aromatic or, in particular, aliphatic or cycloaliphatic in nature.

Reactive resins which can be used may be monofunctional, difunctional, trifunctional, tetrafunctional or more highly functional up to polyfunctional in form, the functionality referring to the cyclic ether group.

Examples, without any wish to impose a restriction, are 3,4-epoxycyclohexylmethyl 3',4'-epoxycyclohexanecarboxylate (EEC) and derivatives, dicyclopentadiene dioxide and derivatives, 3-ethyl-3-oxetanemethanol and derivatives, diglycidyl tetrahydrophthalate and derivatives, diglycidyl hexahydrophthalate and derivatives, 1,2-ethane diglycidyl ether and derivatives, 1,3-propane diglydicyl ether and derivatives, 1,4-butanediol diglycidyl ether and derivatives, higher 1,n-alkane diglycidyl ethers and derivatives, bis[(3,4-epoxycyclohexyl)methyl] adipate and derivatives, vinylcyclohexyl dioxide and derivatives, 1,4-cyclohexanedimethanol bis(3,4-epoxycyclohexanecarboxylate) and derivatives, diglycidyl 4,5-epoxy-tetrahydrophthalate and derivatives, bis[1-ethyl(3-oxetanyl)methyl] ether and derivatives, pentaerythritol tetraglycidyl ether and derivatives, bisphenol A diglycidyl ether (DGEBA), hydrogenated bisphenol A diglycidyl ether, bisphenol F diglycidyl ether, hydrogenated bisphenol F diglycidyl ether, epoxyphenol novolacs, hydrogenated epoxyphenol novolacs, epoxycresol novolacs, hydrogenated epoxycresol novolacs, 2-(7-oxabicyclo; spiro[1,3-dioxane-5,3'-[7]oxabicyclo[4.1.0]heptane], 1,4-bis((2,3-epoxypropoxy)methyl)cyclohexane.

Reactive resins can be used in their monomeric form or else dimeric form, trimeric form, etc., up to and including their oligomeric form.

Mixtures of reactive resins with one another, but also with other coreactive compounds such as alcohols (monofunctional or polyfunctional) or vinyl ethers (monofunctional or polyfunctional), are likewise possible.

Initiators which can be used for cationic UV curing, are, in particular, sulfonium-, iodonium- and metallocene-based systems. The amount of photoinitiator used here is preferably less than 5%, especially less than 3%, more preferably less than 2% and very preferably less than 1%, based on the amount of reactive resin. A fraction of less than 5% photoinitiator based on the amount of reactive resin, means for example that for an amount of 1 kg of reactive resin less than 50 g of photoinitiator are added.

As examples of sulfonium-based cations, reference is made to the details in U.S. Pat. No. 6,908,722 B1 (especially columns 10 to 21).

Examples of anions which serve as counterions to the abovementioned cations include tetrafluoroborate, tetraphenylborate, hexafluorophosphate, perchlorate, tetrachloroferrate, hexafluoroarsenate, hexafluoroantimonate, pentafluorohydroxyantimonate, hexachloro-antimonate, tetrakispentafluorophenylborate, tetrakis(pentafluoromethylphenyl)borate, bi(trifluoromethylsulfonyl)amides and tris(trifluoromethylsulfonyl)methides. Additionally conceivable as anions, especially for iodonium-based initiators, are also chloride, bromide or iodide, although preference is given to initiators essentially free of chlorine and bromine.

More specifically, the usable systems include
sulfonium salts (see, for example, U.S. Pat. No. 4,231,951 A, U.S. Pat. No. 4,256,828 A, U.S. Pat. No. 4,058,401 A, U.S. Pat. No. 4,138,255 A and US 2010/063221 A1) such as triphenylsulfonium hexafluoroarsenate, triphenylsulfonium hexafluoroborate, triphenylsulfonium tetrafluoroborate, triphenylsulfonium tetrakis(pentafluorobenzyl)borate, methyldiphenylsulfonium tetrafluoroborate, methyldiphenylsulfonium tetrakis(pentafluoro-benzyl)borate, dimethylphenylsulfonium hexafluorophosphate, triphenylsulfonium hexafluorophosphate, triphenylsulfonium hexafluoroantimonate, diphenyl-naphthylsulfonium hexafluoroarsenate, tritolylsulfonium hexafluorophosphate, anisyldiphenylsulfonium hexafluoroantimonate, 4-butoxyphenyldiphenylsulfonium tetrafluoroborate, 4-chlorophenyldiphenylsulfonium hexafluoroantimonate, tris(4-phenoxyphenyl)-sulfonium hexafluorophosphate, di(4-ethoxyphenyl)methylsulfonium hexafluoroarsenate, 4-acetylphenyldiphenylsulfonium tetrafluoroborate, 4-acetylphenyldiphenylsulfonium tetrakis(pentafluorobenzyl)borate, tris(4-thiomethoxyphenyl)sulfonium hexafluorophosphate, di(methoxysulfonylphenyl)methylsulfonium hexafluoroantimonate, di(methoxynaphthyl)methylsulfonium tetrafluoroborate, di(methoxynaphthyl)-methylsulfonium tetrakis(pentafluorobenzyl)borate, di(carbomethoxyphenyl)methylsulfonium hexafluorophosphate, (4-octyloxyphenyl)diphenylsulfonium tetrakis(3,5-bis(trifluoromethyl)phenyl)borate, tris[4-(4-acetylphenyl)thiophenyl]sulfonium tetrakis(pentafluorophenyl)borate, tris(dodecylphenyl)sulfonium tetrakis(3,5-bis(trifluoro-methyl)phenyl)borate, 4-acetamidophenyldiphenylsulfonium tetrafluoroborate, 4-acetamidophenyldiphenylsulfonium tetrakis(pentafluorobenzyl)borate, dimethylnaphthylsulfonium hexafluorophosphate, trifluoromethyldiphenylsulfonium tetrafluoroborate, trifluoromethyldiphenylsulfonium tetrakis(pentafluorobenzyl)borate, phenylmethyl-benzylsulfonium hexafluorophosphate, 5-methylthianthrenium hexafluorophosphate, 10-phenyl-9,9-dimethylthioxanthenium hexafluorophosphate, 10-phenyl-9-oxothioxanthenium tetrafluoroborate, 10-phenyl-9-oxothioxanthenium tetrakis(pentafluorobenzyl)borate, 5-methyl-10-oxothianthrenium tetrafluoroborate, 5-methyl-10-oxothianthrenium tetrakis(pentafluorobenzyl)borate and 5-methyl-10,10-dioxothianthrenium hexafluorophosphate, iodonium salts (see, for example, U.S. Pat. No. 3,729,313 A, U.S. Pat. No. 3,741,769 A, U.S. Pat. No. 4,250,053 A, U.S. Pat. No. 4,394,403 A and US 2010/063221 A1) such as diphenyliodonium tetrafluoroborate, di(4-methylphenyl)iodonium tetrafluoroborate, phenyl-4-methylphenyliodonium tetrafluoroborate, di(4-chlorophenyl)iodonium hexafluorophosphate, dinaphthyliodonium tetrafluoroborate, di(4-trifluoromethylphenyl)iodonium tetrafluoroborate, diphenyliodonium hexafluorophosphate, di(4-methylphenyl)iodonium hexafluorophosphate, diphenyliodonium hexafluoroarsenate, di(4-phenoxyphenyl)iodonium tetrafluoroborate, phenyl-2-thienyliodonium hexafluorophosphate, 3,5-dimethylpyrazolyl-4-phenyliodonium hexafluorophosphate, diphenyliodonium hexafluoroantimonate, 2,2'-diphenyliodonium tetrafluoroborate, di(2,4-dichlorophenyl)iodonium hexafluorophosphate, di(4-bromophenyl)iodonium hexafluorophosphate, di(4-methoxyphenyl)iodonium hexafluorophosphate, di(3-carboxyphenyl)iodonium hexafluorophosphate, di(3-methoxycarbonylphenyl)iodonium hexafluorophosphate, di(3-methoxysulfonylphenyl)iodonium hexafluorophosphate, di(4-acetamidophenyl)-iodonium hexafluorophosphate, di(2-benzothienyl)iodonium hexafluorophosphate, diaryliodonium tristrifluoromethylsulfonylmethide such as diphenyliodonium hexafluoroantimonate, diaryliodonium tetrakis(pentafluorophenyl)borate such as diphenyliodonium tetrakis(pentafluorophenyl)borate, (4-n-desiloxyphenyl)phenyliodonium hexafluoroantimonate, [4-(2-hydroxy-n-tetradesiloxy)phenyl]phenyliodonium hexafluoroantimonate, [4-(2-hydroxy-n-tetradesiloxy)phenyl]phenyliodonium trifluorosulfonate, [4-(2-hydroxy-n-tetradesiloxy)phenyl]phenyliodonium hexafluorophosphate, [4-(2-hydroxy-n-tetradesiloxy)phenyl]phenyliodonium tetrakis(pentafluoro-phenyl)borate, bis(4-tert-butylphenyl)iodonium hexafluoroantimonate, bis(4-tert-butylphenyl)iodonium hexafluorophosphate, bis(4-tert-butylphenyl)iodonium trifluorosulfonate, bis(4-tert-butylphenyl)iodonium tetrafluoroborate, bis(dodecylphenyl) iodonium hexafluoroantimonate, bis(dodecylphenyl)iodonium tetrafluoroborate, bis(dodecylphenyl)iodonium hexafluorophosphate, bis(dodecylphenyl)iodonium trifluoromethylsulfonate, di(dodecylphenyl)iodonium hexafluoroantimonate, di(dodecylphenyl)iodonium triflate, diphenyliodonium bisulfate, 4,4'-dichlorodiphenyliodonium bisulfate, 4,4'-dibromodiphenyliodonium bisulfate, 3,3'-dinitrodiphenyliodonium bisulfate, 4,4'-dimethyldiphenyliodonium bisulfate, 4,4'-bis(succinimidodiphenyl)iodonium bisulfate, 3-nitrodiphenyliodonium bisulfate, 4,4'-dimethoxydiphenyliodonium bisulfate, bis(dodecylphenyl)iodonium tetrakis(pentafluorophenyl)borate, (4-octyloxyphenyl)phenyliodonium tetrakis(3,5-bis-trifluoromethylphenyl)borate and (tolylcumyl)iodonium tetrakis(pentafluorophenyl)borate, and ferrocenium salts (see, for example, EP 542 716 B1) such as η5-(2,4-cyclopentadien-1-yl)-[(1,2,3,4,5,6,9)-(1-methylethypenzene]iron.

Examples of commercialized photoinitiators are Cyracure UVI-6990, Cyracure UVI-6992, Cyracure UVI-6974 and Cyracure UVI-6976 from Union Carbide, Optomer SP-55, Optomer SP-150, Optomer SP-151, Optomer SP-170 and Optomer SP-172 from Adeka, San-Aid SI-45L, San-Aid SI-60L, San-Aid SI-80L, San-Aid SI-100L, San-Aid SI-110L, San-Aid SI-150L and San-Aid SI-180L from Sanshin Chemical, SarCat CD-1010, SarCat CD-1011 and SarCat CD-1012 from Sartomer, Degacure K185 from Degussa, Rhodorsil Photoinitiator 2074 from Rhodia, CI-2481, CI-2624, CI-2639, CI-2064, CI-2734, CI-2855, CI-2823 and CI-2758 from Nippon Soda, Omnicat 320, Omnicat 430, Omnicat 432, Omnicat 440, Omnicat 445, Omnicat 550, Omnicat 550 BL and Omnicat 650 from IGM Resins, Daicat II from Daicel, UVAC 1591 from Daicel-Cytec, FFC 509 from 3M, BBI-102, BBI-103, BBI-105, BBI-106, BBI-109, BBI-110, BBI-201, BBI, 301, BI-105, DPI-105, DPI-106, DPI-109, DPI-201, DTS-102, DTS-103, DTS-105, NDS-103, NDS-105, NDS-155, NDS-159, NDS-165, TPS-102, TPS-103, TPS-105, TPS-106, TPS-109, TPS-1000, MDS-103, MDS-105, MDS-109, MDS-205, MPI-103, MPI-105, MPI-106, MPI-109, DS-100, DS-101, MBZ-101, MBZ-201, MBZ-301, NAI-100, NAI-101, NAI-105, NAI-106, NAI-109, NAI-1002, NAI-1003, NAI-1004, NB-101, NB-201, NDI-101, NDI-105, NDI-106, NDI-109, PAI-01, PAI-101, PAI-106, PAI-1001, PI-105, PI-106, PI-109, PYR-100, SI-101, SI-105, SI-106 and SI-109 from Midori Kagaku, Kayacure PCI-204, Kayacure PCI-205, Kayacure PCI-615, Kayacure PCI-625, Kayarad 220 and Kayarad 620, PCI-061T, PCI-062T, PCI-020T, PCI-022T from Nippon Kayaku, TS-01 and TS-91 from Sanwa Chemical, Deuteron UV 1240 from Deuteron, Tego Photocompound 1465N from Evonik, UV 9380 C-D1 from GE Bayer Silicones, FX 512 from Cytec, Silicolease UV Cata 211 from Bluestar Silicones and Irgacure 250, Irgacure 261, Irgacure 270, Irgacure PAG 103, Irgacure PAG 121, Irgacure PAG 203, Irgacure PAG 290, Irgacure CGI 725, Irgacure CGI 1380, Irgacure CGI 1907 and Irgacure GSID 26-1 from BASF.

The skilled person is aware of further systems that can likewise be employed in accordance with the invention. Photoinitiators are employed uncombined or as a combination of two or more photoinitiators.

Polar initiators in the sense of the patent application are organic salts which contain a positive and negative charge in the molecule. As examples of sulfonium-based cations, reference may be made to the details in U.S. Pat. No. 6,908,722 B1 (especially columns 10 to 21). Examples are those initiators with charges and already stated under photoinitiators.

Nonionic surfactants are known to the skilled person and are amphiphilic molecules, consisting of a polar and an apolar portion. These interface-active substances allow polar and apolar substances to be mixed. Examples are polyoxyethylene glycol alkyl ethers (Brij®), polyoxypropylene glycol alkyl ethers, glucoside alkyl ethers, polyoxyethylene glycol alkylphenol ethers (Triton®), glycerol alkyl esters, sorbitan alkyl esters (Span®), and PEO-PPO-PEO triblock copolymers (Pluronic®).

The general expression "adhesive tape" encompasses a carrier material which is provided on one or both sides with a (pressure-sensitive) adhesive. The carrier material encompasses all sheetlike structures, examples being two-dimensionally extended films or film sections, tapes with an extended length and limited width, tape sections, diecuts (in the form of edge surrounds or borders of an (opto)electronic arrangement, for example), multi-layer arrangements, and the like. For different applications it is possible to combine a very wide variety of different carriers, such as, for example, films, woven fabrics, nonwovens and papers, with the adhesives. Furthermore, the expression "adhesive tape" also encompasses what are called "adhesive transfer tapes", i.e. an adhesive tape without carrier. In the case of an adhesive transfer tape, the adhesive is instead applied prior to application between flexible liners which are provided with a release coat and/or have anti-adhesive properties. For application, generally, first one liner is removed, the adhesive is applied, and then the second liner is removed. The adhesive can thus be used directly to join two surfaces in (opto)electronic arrangements.

Also possible, however, are adhesive tapes which operate not with two liners, but instead with a single liner with double-sided release. In that case the web of adhesive tape is lined on its top face with one side of a double-sidedly releasing liner, while its bottom face is lined with the reverse side of the double-sidedly releasing liner, more particularly of an adjacent turn on a bale or roll.

As the carrier material of an adhesive tape it is preferred in the present case to use polymer films, film composites, or films or film composites that have been provided with organic and/or inorganic layers. Such films/film composites may be composed of any common plastics used for film manufacture, examples—though without restriction—including the following:

polyethylene, polypropylene—especially the oriented polypropylene (OPP) produced by monoaxial or biaxial stretching, cyclic olefin copolymers (COC), polyvinyl chloride (PVC), polyesters—especially polyethylene terephthalate (PET) and polyethylene naphthalate (PEN), ethylene-vinyl alcohol (EVOH), polyvinylidene chloride (PVDC), polyvinylidene fluoride (PVDF), polyacrylonitrile (PAN), polycarbonate (PC), polyamide (PA), polyethersulfone (PES) or polyimide (PI).

In the case of double-sidedly (self-)adhesive tapes, the adhesives used as the top and bottom layer may be identical or different adhesives of the invention, and/or the layer thicknesses thereof that are used may be the same or different. The carrier in this case may have been pretreated according to the prior art on one or both sides, with the achievement, for example, of an improvement in adhesive anchorage. It is also possible for one or both sides to have been furnished with a functional layer which is able to function, for example, as a shutout layer. The layers of PSA may optionally be lined with release papers or release films. Alternatively it is also possible for only one layer of adhesive to be lined with a double-sidedly releasing liner.

In one version, an adhesive of the invention is provided in the double-sidedly (self-)adhesive tape, and also any desired further adhesive is provided, for example one which adheres particularly well to a masking substrate or exhibits particularly good repositionability.

The thickness of the PSA, present either in the form of an adhesive transfer tape or coated on a sheetlike structure, is preferably between 1 µm and 2000 µm, more preferably between 5 µm and 500 µm, and very preferably between about 12 µm and 250 µm.

Layer thicknesses between 50 μm and 150 μm are used when the aim is to achieve improved adhesion on the substrate and/or a damping effect.

Layer thicknesses between 1 μm and 50 μm reduce the amount of material used. However, there is a reduction of the adhesion from the substrate.

For double-sided adhesive tapes it is likewise the case for the adhesive(s) that the thickness of the individual layer or layers of PSA is preferably between 1 μm and 2000 μm, more preferably between 5 μm and 500 μm, and very preferably between about 12 μm and 250 μm. Where another adhesive is used as well as the one adhesive of the invention in double-sided adhesive tapes, it may also be advantageous if its thickness is above 150 μm.

Examples

Measurement Methods

Test Method for Determining the Yellowness Index (LAB Measurement)

The Lab color space is a color space which covers the range of perceptible colors (see DIN EN ISO 11664-4). It has been ascertained that the b* value in particular correlates with the perceptible of degree of yellowing. b* values of more than 1 are perceived as distinct yellowing, and are therefore undesirable.

LAB measurement took place according to DIN EN ISO 11664-3.

Illuminant/light standard: D60

Observer angle: 10°

The transparent specimen was measured against a white reference tile. The data recorded are plotted relatively as L*a*b* values against the white reference tile, and are calculated as follows: $b^* = b^*_{exp} - b^*_{ref}$. For application, the yellowing b* in particular is relevant. Accordingly, the other values are not plotted. Since the yellowing decreases in the presence of atmospheric humidity, all of the specimens were prepared under inert gas ($N_2$, $H_2O$ content <2 ppm) in a glovebox, and exposed and, where appropriate, thermally after-treated under the same conditions. The yellowness index was measured directly after removal in a conditioned space (23° C., 50% relative humidity). This approach makes sense since it is more realistic for applications relating to the sheetlike encapsulation of organic electronics to operate in the absence of moisture, and the yellowness indices determined in this way are therefore closer to reality.

MMAP and DACP

MMAP is the mixed methylcyclohexane-aniline cloud point, determined using a modified ASTM C 611 method. Methylcyclohexane is used for the heptane employed in the standard test method. The method uses resin/aniline/methylcyclohexane in a ratio of 1/2/1 (5 g/10 ml/5 ml), and the cloud point is determined by cooling a heated, clear mixture of the three components until complete clouding is just established.

The DACP is the diacetone cloud point, and is determined by cooling a heated solution of 5 g resin, 5 g xylene and 5 g diacetone alcohol until the point is reached at which the solution turns cloudy.

Water Vapor Permeation Rate

The WVTR is measured at 38° C. and 90% relative humidity as per ASTM F-1249; the OTR is measured at 23° C. and 50% relative humidity as per DIN 53380 Part 3. A duplicate determination is carried out in each case and the average is formed. The value reported is standardized to a thickness of 50 μm/is based on the respective thickness of the test specimen measured.

For the measurements, the adhesive transfer tapes were adhered to a highly permeable polysulfone membrane (available from Sartorius) which itself makes no contribution to the permeation barrier. The measurements were performed on crosslinked adhesive tapes.

Softening Temperature

The reactive resin or tackifier resin softening temperature is conducted according to the relevant methodology, which is known as ring and ball and is standardized according to ASTM E28.

The tackifier resin softening temperature of the resins is determined using an automatic ring & ball tester HRB 754 from Herzog. Resin specimens are first finely mortared. The resulting powder is introduced into a brass cylinder with a base aperture (internal diameter at the top part of the cylinder 20 mm, diameter of the base aperture of the cylinder 16 mm, height of the cylinder 6 mm) and melted on a hotplate. The amount introduced is selected such that the resin after melting fully fills the cylinder without protruding.

The resulting sample body, complete with cylinder, is inserted into the sample mount of the HRB 754. Glycerin is used to fill the heating bath where the tackifier resin softening temperature lies between 50° C. and 150° C. For lower tackifier resin softening temperatures, it is also possible to operate with a waterbath. The test balls have a diameter of 9.5 mm and weigh 3.5 g. In line with the HRB 754 procedure, the ball is arranged above the sample body in the heating bath and is placed down on the sample body. 25 mm beneath the base of the cylinder is a collecting plate, which has a light barrier 2 mm above it. During the measuring procedure, the temperature is raised at 5° C./min. Within the temperature range of the tackifier resin softening temperature, the ball begins to move through the base aperture in the cylinder, until finally coming to rest on the collecting plate. In this position, it is detected by the light barrier, and at this point in time the temperature of the heating bath is recorded. A duplicate determination is conducted. The tackifier resin softening temperature is the average value from the two individual measurements.

Layers of Adhesive Composition:

Layers of adhesive composition were produced by applying various adhesive compositions from solution to a conventional liner (siliconized polyester film) by means of a laboratory coater, and drying. The thickness of the adhesive layer after drying is 50±5 μm. Drying took place in each case first at RT for 10 minutes and at 120° C. for 10 minutes in a laboratory drying cabinet. Each of the dried layers of adhesive was laminated immediately after drying with a second liner (siliconized polyester film of lower release force) on the open side.

TABLE 1

Substances used for the PSAs
PSAs - Substances used

| | |
|---|---|
| Kraton G 1657 | SEBS with 13 wt % block polystyrene content from Kraton. The SEBS contained 36 wt % diblock content. |

TABLE 1-continued

Substances used for the PSAs
PSAs - Substances used

| | |
|---|---|
| SiBStar 62M | SiBS with 20 wt % block polystyrene content from Kaneka. The SiBS contained 50 wt % diblock content. |
| Uvacure 1500 | cycloaliphatic diepoxide from Dow |
| Synasia S-101 | 3-ethyl-3-hydroxymethyloxetane from Synasia (CAS: 3047-32-3) |
| Regalite R1100 | a fully hydrogenated hydrocarbon resin from Eastman (ring and ball 100° C., DACP = 45, MMAP = 82), |
| Triarylsulfonium hexafluoroantimonate | cationic photoinitiator from Sigma-Aldrich. The photoinitiator has an absorption maximum in the 320 nm to 360 nm range and took the form of a 50 wt % strength solution in propylene carbonate. |
| Brij ®93 | polyoxyethylene (2) oleyl ether, linear formula $C_{18}H_{35}(OCH_2CH_2)_nOH$, n~2 |

The (apolar) elastomer (Kraton G 1657) and the plasticizer resin (Regalite 1100) were dissolved in a mixture of toluene (300 parts), acetone (150 parts), and special-boiling-point spirit 60/95 (550 parts). Added to the solution was a solution of the reactive resins (Uvacure 1500, S-101), of the photoinitiator (triarylsulfonium hexafluoroantimonate), and—in the case of examples K1 to K4—of the nonionic surfactant (Brij® 93), and vigorous stirring was carried out using a propeller stirrer. The solids content of the completed PSA was 50%.

TABLE 2

Composition of the example adhesives

| | Example: | | | | |
|---|---|---|---|---|---|
| | V1 Parts by weight | K1 Parts by weight | K2 Parts by weight | K3 Parts by weight | K4 Parts by weight |
| Kraton G 1657 | 37.5 | 36.15 | 36.7 | 37.3 | — |
| SiBStar 62M | — | — | — | — | 36.15 |
| Uvacure 1500 | 21.3 | 20.5 | 20.8 | 21.2 | 20.5 |
| Trimethylpropane oxetane (Synasia S-101) | 3.7 | 3.6 | 3.7 | 3.7 | 3.6 |
| Ragalite R1100 | 37.5 | 36.15 | 36.7 | 37.3 | 36.15 |
| Brij ®93 | 0 | 3.6 | 2.1 | 0.5 | 3.6 |
| Triarylsulfonium hexafluoroantimonate | 0.1 | 0.1 | 0.1 | 0.1 | 0.1 |

The results for the moisture permeation measurement of the exemplary adhesives (V1 and K1 to K4) are reproduced in table 3.

TABLE 3

| | V1 | K1 | K2 | K3 | K4 |
|---|---|---|---|---|---|
| WVTR/g $m^{-2}d^{-1}$ | 46 | 56 | 47 | 44 | 7.6 |

It can be seen that the use of SiBStar 62M rather than Kraton G 1657 significantly reduces the water vapor permeation rate and makes the adhesive in question especially suitable for use as a barrier adhesive.

The yellowness index of the individual exemplary adhesives was then determined. The results are reproduced in table 4.

TABLE 4

Results of two-fold determination of the yellowness index of adhesives after UV irradiation and thermal aftertreatment (1 h, 80° C.).

| Sample designation | b* |
|---|---|
| V1 | 5.41 |
| K1 | 0.40 |
| K2 | 1.42 |
| K3 | 2.83 |
| K4 | 0.61 |

The data show the distinct reduction in the yellowness index in examples K1 to K4 in contrast to the comparative example, V1.

In the appended figures, the result from a statistical experimental plan is reproduced as well. Here, FIG. 1 shows the yellowness index b* after UV irradiation (400 mJ/m²), and FIG. 2 shows the yellowness index after UV irradiation and thermal after treatment for 1 h at 80° C., each as a function of the amount of surfactant relative to the reactive resin.

Figure 2:
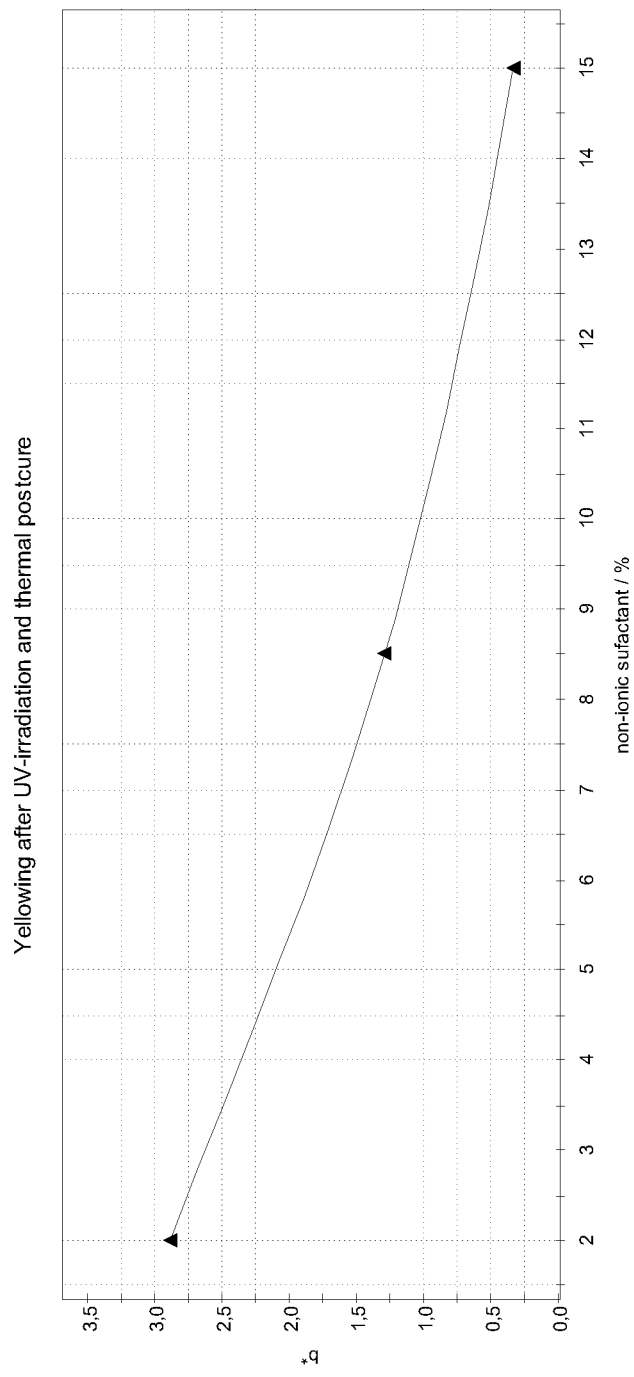
FIG. 2 illustrates a graph showing yellowness index after UV irradiation and thermal after treatment as a function of the amount of surfactant relative to the reactive resin.

The addition of the surfactant results in a significant reduction in the yellowing after UV irradiation (FIG. 1). The conversion of cationically curing epoxide systems is typically increased via thermal aftertreatment (for example, 1 h at 80° C.). In this case the effect is even more pronounced. The yellowness index is reduced sharply from approximately b*~5 (no surfactant) through b*~3 (2% surfactant) to b*<0.5 (15% surfactant) (FIG. 2).

The results show that with the method of the invention it is possible to produce apolar hybrid adhesive compositions which exhibit significantly less yellowing after irradiation (and thermal aftertreatment).

The invention claimed is:
1. An adhesive composition comprising
   an adhesive base composed of
      at least one reactive resin
      at least one elastomer
      at least one polar photoinitiator, and
   optionally, a nonaqueous solvent,
   wherein
   the adhesive composition further comprises a nonionic surfactant for reducing the yellowness index of the cured adhesive composition.
2. The adhesive composition according to claim 1, wherein the adhesive composition is pressure-sensitively adhesive.
3. The adhesive composition according to claim 1, wherein the elastomer is apolar.

4. The adhesive composition according to claim 1, wherein the reactive resin is a cyclic ether selected from epoxides and oxetanes.

5. The adhesive composition according to claim 1, wherein the adhesive composition further comprises at least one at least partially hydrogenated tackifier resin.

6. The adhesive composition according to claim 1, wherein the adhesive composition is subjected to thermal or radiation-induced curing.

7. The adhesive composition according to claim 1, wherein the fraction of nonionic surfactant, based on the amount of reactive resin, is 1 to 50%.

8. The adhesive composition according to claim 1, wherein the adhesive base has a water vapor permeation rate, after the activation of the reactive resin component, of less than 100 $g/m^2 d$.

9. The adhesive composition according to claim 1, wherein the adhesive composition is soluble in nonaqueous solvents.

10. An adhesive tape comprising the adhesive composition according to claim 1.

11. A method comprising:
    encapsulating one or more assemblies in organic electronics with the adhesive composition according to claim 1.

12. A method for producing the adhesive composition according to claim 1, comprising:
    a) dissolving the elastomer and optionally tackifier resin in a nonaqueous solvent;
    b) adding a solution of the reactive resin, the nonionic surfactant, and the polar photoinitiator to form a mixture; and
    c) stirring the mixture.

13. The adhesive composition according to claim 7, wherein the fraction of nonionic surfactant, based on the amount of reactive resin, is 5 to 17%.

14. The adhesive composition according to claim 8, wherein the adhesive base has a water vapor permeation rate, after the activation of the reactive resin component, of less than 15 $g/m^2 d$.

* * * * *